US011222668B1

(12) United States Patent
Vimercati et al.

(10) Patent No.: US 11,222,668 B1
(45) Date of Patent: Jan. 11, 2022

(54) MEMORY CELL SENSING STRESS MITIGATION

(71) Applicant: Micron Technology, Inc., Boise, ID (US)

(72) Inventors: Daniele Vimercati, El Dorado Hills, CA (US); Duane R. Mills, Shingle Springs, CA (US); Richard E. Fackenthal, Carmichael, CA (US); Yasuko Hattori, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/004,402

(22) Filed: Aug. 27, 2020

(51) Int. Cl.
*G11C 11/22* (2006.01)
*G11C 11/56* (2006.01)
*G11C 7/06* (2006.01)
*G11C 7/10* (2006.01)
*G11C 7/14* (2006.01)

(52) U.S. Cl.
CPC ............ *G11C 7/062* (2013.01); *G11C 7/1048* (2013.01); *G11C 7/14* (2013.01); *G11C 11/221* (2013.01); *G11C 11/2257* (2013.01); *G11C 11/2273* (2013.01); *G11C 11/2275* (2013.01); *G11C 11/5657* (2013.01)

(58) Field of Classification Search
CPC ....... G11C 7/062; G11C 7/01048; G11C 7/14; G11C 11/2257; G11C 11/2273; G11C 11/2275; G11C 11/221; G11C 11/5657

USPC .......................................... 365/145, 207, 208
See application file for complete search history.

(56) References Cited

U.S. PATENT DOCUMENTS

| 5,262,982 A * | 11/1993 | Brassington | G11C 11/22 365/145 |
| 6,830,938 B1 * | 12/2004 | Rodriguez | H01L 27/11502 257/E21.009 |
| 7,149,137 B2 * | 12/2006 | Rodriguez | G11C 11/22 365/201 |
| 9,123,407 B2 * | 9/2015 | Ryu | G11C 7/20 |
| 10,269,442 B1 * | 4/2019 | Tortorelli | H01L 45/06 |
| 10,546,629 B1 * | 1/2020 | Vimercati | G11C 11/4094 |

* cited by examiner

*Primary Examiner* — Son L Mai
(74) *Attorney, Agent, or Firm* — Holland & Hart LLP

(57) ABSTRACT

Methods, systems, and devices for memory cell sensing stress mitigation are described. A memory device may be configured to bias a memory cell to a voltage with a first polarity or a second polarity (e.g., a positive voltage or a negative voltage) during an access operation to level wear experienced by the memory cell during the access operation. For example, during a first read operation, a first pulse with the first polarity (e.g., a negative voltage) may be applied to the memory cell to read out a first logic state stored at the memory cell. During a second read operation, a second pulse with the second polarity (e.g., a positive voltage) may be applied to the memory cell to read out a second logic state stored at the memory cell. The memory device may include a selection component for selecting between the different pulses used for different read operations.

24 Claims, 8 Drawing Sheets

MEMORY CELL SENSING STRESS MITIGATION

BACKGROUND

The following relates generally to one or more systems for memory and more specifically to memory cell sensing stress mitigation.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
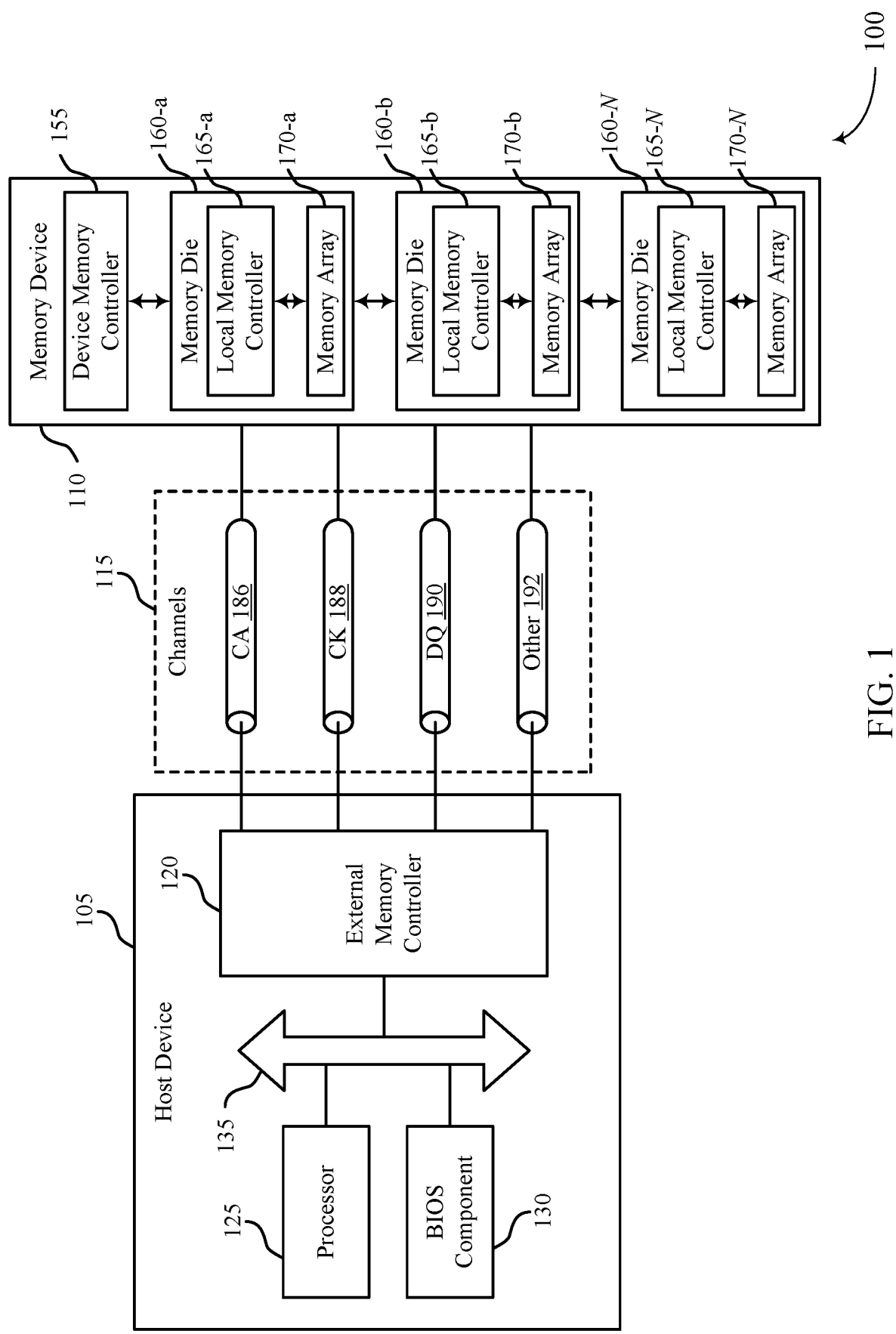
FIG. 1 illustrates an example of a system that supports memory cell sensing stress mitigation in accordance with examples as disclosed herein.

Memory devices may use various components to bias access lines (e.g., digit lines, word lines, plate lines, etc.) of a memory die to access memory cells of that memory die. For example, the access lines of the memory die may be biased to access information stored in memory cells coupled with the access lines. As part of an access operation, a signal (e.g., a voltage) corresponding to a charge stored in a memory cell may be extracted via an access line (e.g., a digit line). The extracted signal may charge a capacitor (e.g., an amplification capacitor (AMPCAP)). A sense component (e.g., a latch) may compare the extracted signal with a reference signal (e.g., a reference voltage which charges a reference capacitor) to determine a logic state (e.g., a logic 1 or a logic 0) stored in the memory cell.

In some cases, a memory cell may become imprinted (e.g., a ferroelectric memory cell), which may affect the reliability of access operations for the memory cell. That is, asymmetric voltage biasing across the memory cell (such as for access operations, duty cycles to maintain a stored logic state, etc.) may result in uneven wear on materials or components of the memory cell, which may affect performance of the memory cell over time. In some cases, a memory device may bias the memory cell to a voltage with a same polarity (e.g., a positive voltage or a negative voltage) during each access operation (e.g., during each read operation), which may result in degradation at the memory cell due to imprinting. For example, the memory device may use a greater voltage of an opposite polarity to perform a write operation for the imprinted memory cell, which may reduce write efficiency, or in some cases stress or damage the memory cell or other components of the memory device.

According to the techniques described herein, a memory device may be configured to bias a memory cell to a voltage with a first polarity or a second polarity (e.g., a positive voltage or a negative voltage) during an access operation (e.g., a read operation) to improve wear experienced by the memory cell. For example, during a first read operation, a first pulse with the first polarity (e.g., a negative voltage) may be applied to the memory cell to read out a first logic state stored at the memory cell. During a second read operation, a second pulse with the second polarity (e.g., a positive voltage) may be applied to the memory cell to read out a second logic state stored at the memory cell. The memory device may include a selection component for selecting between the first pulse and the second pulse used in the different read operations. In some cases, the first pulse and the second pulse may be associated with a first sensing mode and a second sensing mode, respectively. Based on the selected sensing mode, a reference component may be configured to provide a reference voltage that corresponds to the polarity of the pulse being used to read the memory cell. A sensing component may compare to a voltage extracted from the memory cell to determine the logic state stored at the memory cell. Based on biasing the memory cell to voltages with different polarities in different access operations, the memory device may mitigate stress at the memory cell and improve operational lifetime for the memory cell.

Features of the disclosure are initially described in the context of systems and dies as described with reference to FIGS. 1 and 2. Features of the disclosure are described in the context of hysteresis curves, a timing diagram, a block diagram, and a circuit as described with reference to FIGS. 3A-6. These and other features of the disclosure are further illustrated by and described with reference to an apparatus diagram and a flowchart that relate to memory cell sensing stress mitigation as described with reference to FIGS. 7 and 8.

FIG. 1 illustrates an example of a system 100 that supports memory cell sensing stress mitigation in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

According to the techniques described herein, the memory device 110 may be configured to bias a memory cell of a memory array 170 to a voltage with a first polarity or a second polarity (e.g., a positive voltage or a negative voltage) during an access operation to level wear on the memory cell associated with applying pulses of one or more polarities. For example, in a first sensing mode, a first pulse with the first polarity (e.g., a negative voltage) may be applied to the memory cell to read out a first logic state stored at the memory cell. In a second sensing mode, a second pulse with the second polarity (e.g., a positive voltage) may be applied to the memory cell to read out a second logic state stored at the memory cell. The memory device 110 may include a selection component for selecting between the first and second sensing modes. The selection component may be included in the device memory controller 155 or a local memory controller 165. In some examples, a memory die 160 may include a reference component and a sense component coupled with a memory array 170. Based on the selected sensing mode, the reference component may be configured to provide a corresponding reference voltage, which the sensing component may compare to a voltage extracted from the memory cell to determine the logic state stored at the memory cell. Based on biasing memory cells of the memory arrays 170 to voltages with different polarities, the memory device 110 may mitigate stress at the memory cells and improve operational lifetime for the memory cells.

Figure 2:
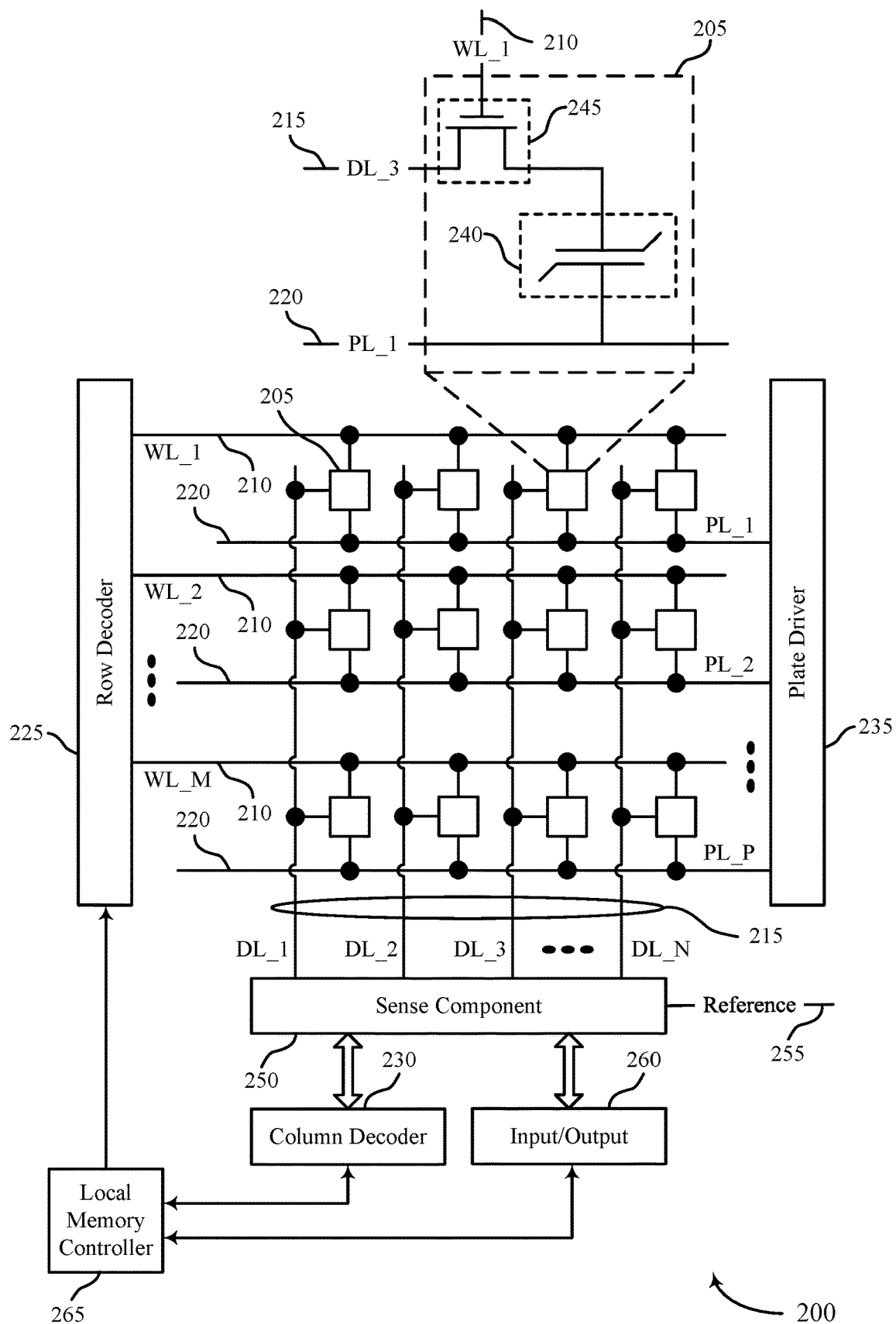
FIG. 2 illustrates an example of a memory die that supports memory cell sensing stress mitigation in accordance with examples as disclosed herein.

FIG. 2 illustrates an example of a memory die 200 that supports memory cell sensing stress mitigation in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a signal (e.g., a reference voltage) provided by a reference component 255. The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference signal received from the reference component 255. Based on that comparison, the sense component 250 may determine a logic state that is stored on the memory cell 205.

According to the techniques described herein, the memory die 200 may be configured to bias a memory cell 205 to a voltage with a first polarity or a second polarity (e.g., a positive voltage or a negative voltage) during an access operation to improve wear for the memory cell 205 or improve a useful life of the memory cell 205 or both. For example, in a first sensing mode, a first pulse with the first polarity (e.g., a negative voltage) may be applied to the memory cell 205 to read out a first logic state stored at the memory cell 205. In a second sensing mode, a second pulse with the second polarity (e.g., a positive voltage) may be applied to the memory cell 205 to read out a second logic state stored at the memory cell 205. The local memory controller 265 may include a selection component for selecting between the first and second sensing modes. Based on the selected sensing mode, the reference component 255 may be configured to provide a corresponding reference voltage, which the sensing component 250 may compare to a voltage extracted from the memory cell 205 to determine the logic state stored at the memory cell 205. Based on biasing memory cells 205 to voltages with different polarities, the memory die 200 may mitigate stress at the memory cells 205 and improve operational lifetime for the memory cells 205.

Figure 3A:
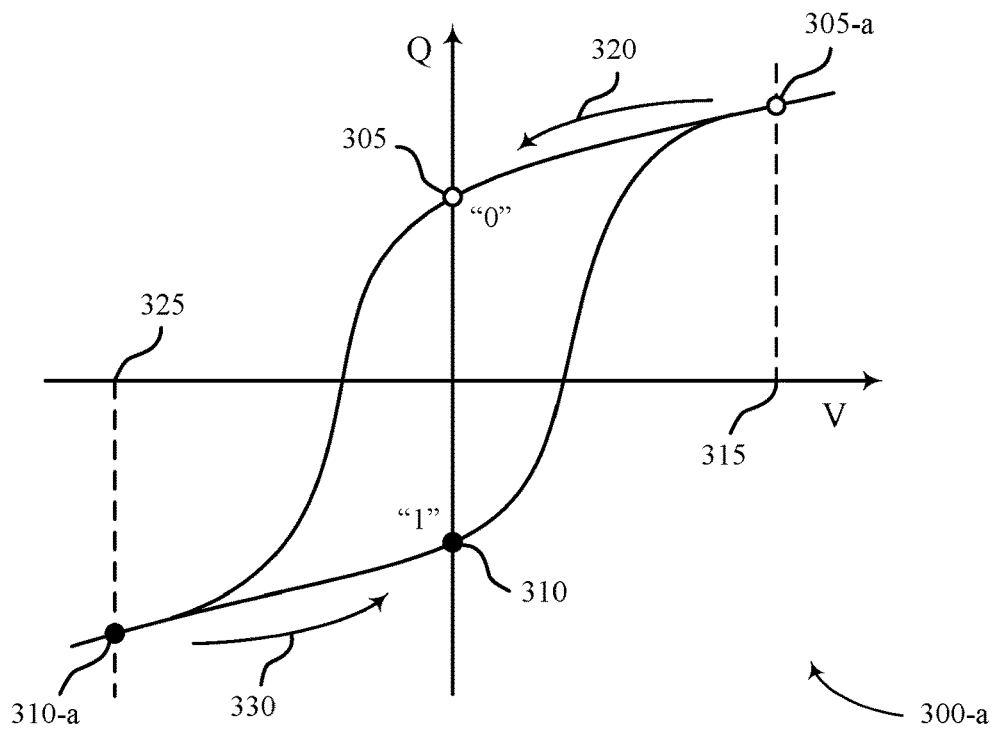
FIGS. 3A and 3B illustrate examples of hysteresis curves that support memory cell sensing stress mitigation in accordance with examples as disclosed herein.
Figure 3B:
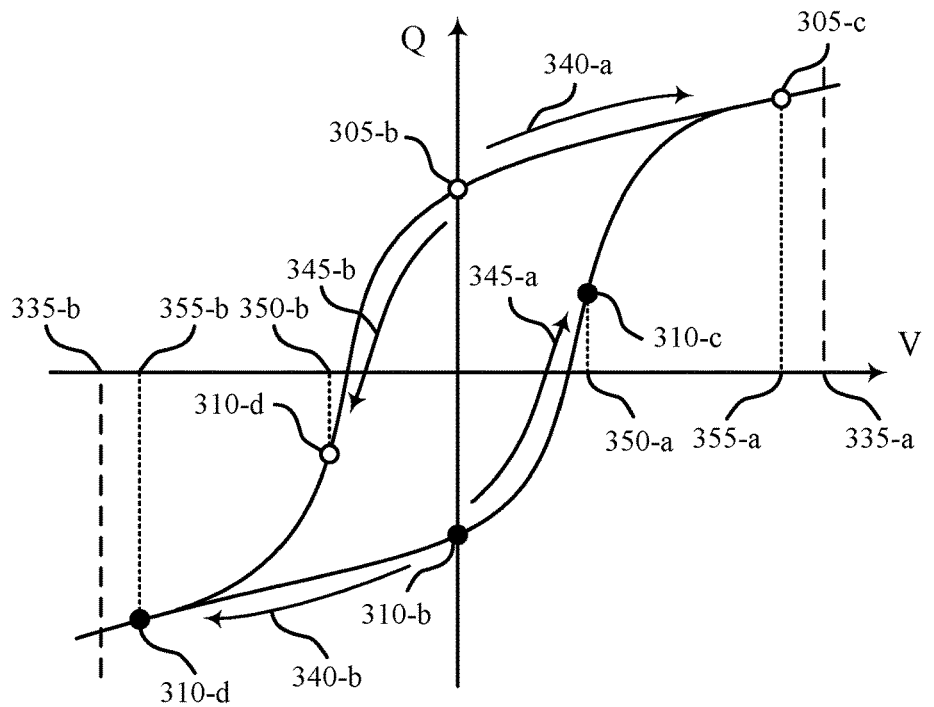

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-a and 300-b represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335-a may be applied across the capacitor 240 as discussed with reference to FIG. 2. In other cases, a fixed voltage may be applied to the cell plate and, although depicted as a positive voltage, voltage 335-a may be negative. In response to voltage 335-a, charge state 305-b may follow path 340-a. Likewise, if charge state 310-b was initially stored, then it follows path 345-a. The final position of charge state 305-c and charge state 310-c depend on one or more factors, including the specific sensing scheme and circuitry.

In some cases, the final charge may depend on the intrinsic capacitance of the digit line connected to the memory cell. For example, if the capacitor is electrically connected to the digit line and voltage 335-a is applied, the voltage of the digit line may rise due to its intrinsic capacitance. A voltage measured at a sense component may not equal voltage 335-a and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350-a or voltage 355-a, may be different and may depend on the initial state of the capacitor.

By comparing the digit line voltage to a reference voltage, the initial state of the capacitor may be determined. The digit line voltage may be the difference between voltage 335-a and the final voltage across the capacitor, voltage 350-a or voltage 355-a—i.e., the difference between the voltage 335-a and the voltage 350-a or the different between the voltage 335-a and the voltage 355-a. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, a ferroelectric memory cell may maintain the initial logic state after a read operation. For example, if charge state 305-b is stored, the charge state may follow path 340-a to charge state 305-c during a read operation and, after removing voltage 335-a, the charge state may return to initial charge state 305-b by following path 340-a in the opposite direction. In some cases, a ferroelectric memory cell may lose its initial logic state after a read operation. For example, if charge state 310-b is stored, the charge state may follow path 345-a to charge state 305-c during a read operation and, after removing voltage 335-a, the charge state may relax to the charge state 305-b by following path 340-a.

Hysteresis curve 300-b illustrates an example of reading a memory cell that is configured to store the charge state 305-b and the charge state 310-b. A read voltage 335-a may be applied, for example, as a voltage difference via a digit line 215 and a plate line 220 as described with reference to FIG. 2. Hysteresis curve 300-b may illustrate read operations where the read voltage 335-a is negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335-a is shown as a negative voltage across the ferroelectric capacitor 240, in alternative operations a read voltage may be a positive voltage across the ferroelectric capacitor 240, which may be referred to as a "plate low" read operation.

The read voltage 335-a may be applied across the ferroelectric capacitor 240 when a memory cell 205 is selected (e.g., by activating a switching component 245 as described with reference to FIG. 2). Upon applying the read voltage 335-a to the ferroelectric capacitor 240, charge may flow into or out of the ferroelectric capacitor 240 via the digit line 215 and plate line 220, and different charge states may result depending on whether the ferroelectric capacitor 240 was at charge state 305-b (e.g., a logic 1) or at charge state 310-b (e.g., a logic 0).

In some cases, the ferroelectric capacitor 240 may become imprinted, which may affect the reliability of access operations for a memory cell. That is, applying the read voltage 335-a during each access operation may result in uneven wear on the ferroelectric capacitor 240, which may affect performance of the memory cell. For example, after imprinting has occurred, a magnitude of the voltage 325 for storing the charge state 310 may be greater than a magnitude of the voltage 315 for storing the charge state 305, which may reduce write efficiency, or in some cases stress or damage the memory cell or other components of a memory device According to the techniques described herein, a memory device may be configured to bias the ferroelectric capacitor 240 to a read voltage 335 with a first polarity or a second polarity (e.g., a positive read voltage 335-a or a negative read voltage 335-b) during different sensing modes of an access operation to level wear on the memory cell associated with applying pulses of one or more polarities or improve a useful life of the memory cell 205 or both. In a first sensing mode, the read voltage 335-a may be applied to the ferroelectric capacitor 240 to read out a first logic state stored at the memory cell. If charge state 305-b is stored, the charge state may follow path 340-a to charge state 305-c, corresponding to voltage 355-a. If charge state 310-b is stored, the charge state may follow path 345-b to charge state 310-c, corresponding to voltage 350-a. In a second sensing mode, the read voltage 335-b may be applied to the ferroelectric capacitor 240 to read out a first logic state stored at the memory cell. If charge state 305-b is stored, the charge state may follow path 340-b to charge state 305-d, corresponding to voltage 355-b. If charge state 310-b is stored, the charge state may follow path 345-b to charge state 310-d, corresponding to voltage 350-b.

The memory device may include a selection component for selecting between the first and second sensing modes. Based on the selected sensing mode, a reference component may be configured to provide a corresponding reference voltage, which a sensing component may compare to a voltage extracted from the memory cell (e.g., the voltage 350 or the voltage 355) to determine the logic state stored at the memory cell. In the first sensing mode, the reference voltage may be a positive voltage between the voltages 350-a and 355-a, and the reference voltage may be a negative voltage between the voltages 350-b and 355-b in the second sensing mode. Based on applying read voltages 335 with different polarities, the memory device may mitigate stress at the ferroelectric capacitor 240 and improve operational lifetime for the memory cell.

Figure 4:
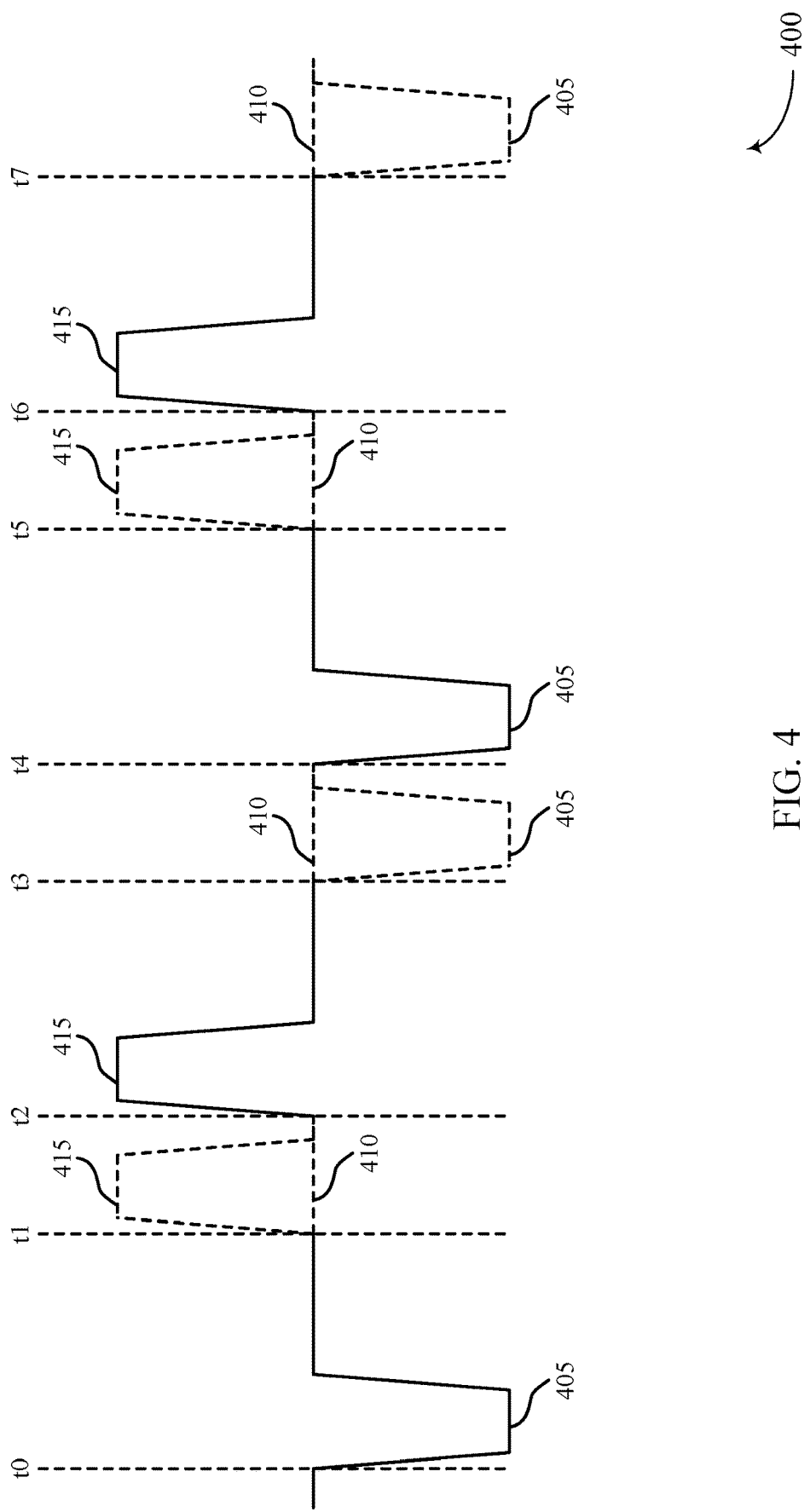
FIG. 4 illustrates an example of a timing diagram that supports memory cell sensing stress mitigation in accordance with examples as disclosed herein.

FIG. 4 illustrates an example of a timing diagram 400 that supports memory cell sensing stress mitigation in accordance with examples as disclosed herein. The timing diagram 400 may illustrate access operations (e.g., a read operation, a write operation, a modify operation, or any combination thereof) associated with a memory cell. The timing diagram 400 shows various voltage levels (e.g., voltage signals as a function of time) associated with components and nodes of a memory cell 205 described with reference to FIG. 2 to illustrate performing an access operation. The time and voltage scales used in FIG. 4 are for illustration purposes and may not depict particular values in some cases.

The time t0 may correspond to an access operation in a first sensing mode. A read pulse with a first polarity (e.g., a negative voltage) may be applied to the memory cell, which may bias the memory cell (e.g., a ferroelectric capacitor of the memory cell) to a bias voltage 405. In some examples, the read pulse may be applied as a voltage difference via a digit line 215 and a plate line 220 as described with reference to FIG. 2. Based on biasing the memory cell, a voltage corresponding to a logic state stored at the memory cell may be output to a sense component for determining the logic state as part of the access operation. The sense component may compare the voltage output from the memory cell to a reference voltage provided by a reference component. In some examples, the first sensing mode may be indicated to the sense component and the reference component to enable the sense component to determine the logic state based on the read pulse with the first polarity. For example, the reference component may be configured to provide a first reference voltage (e.g., a negative reference voltage) in the first sensing mode, and the sense component may be configured to compare the output voltage to the first reference voltage.

The time t1 may correspond to a precharge operation for the memory cell or a write-back operation for the memory cell. Reading a memory cell using the voltage 405 may cause the logic stored by the memory cell to be a certain state. As such, the read operation may 'destroy' the value stored by the memory cell. If the memory cell is storing the correct state after the read operation (e.g., applying the voltage 405), the memory cell may remain at an unbiased voltage 410 (e.g., a ground, or approximately 0V) during the precharge operation. If the memory cell is storing the wrong state after the read operation (e.g., applying the voltage 405), the memory cell may be biased to voltage 415 (e.g., a positive voltage) to store the correct state in the memory cell. The voltage 415 may be an opposite polarity as voltage 405. Because the read operation may result in the correct logic state being stored in the memory cell, the quantity of times the voltage 415 may be applied as part of the read operation in the first sensing mode is likely fewer than the quantity times the voltage 405 may be applied as part of the read operation in the first sensing mode (e.g., voltage 415 may be applied around 50% of the times that voltage 405 is applied). If a read operation is performed using voltage 405 every time, this imbalance in applying voltage 405 (having a first polarity) and voltage 415 (having a second polarity) in a given read operation may result in imprinting or other degradations in the memory cell.

The precharge operation may correspond to an access operation following the precharge operation. For example, as part of the precharge operation, the digit line associated with the memory cell may be biased to a first voltage and the plate line associated with the memory cell may be biased to a second voltage. The first and second voltages may be based on the sensing mode of the access operation following the precharge operation. The access operation following the precharge operation at the time t1 may have a second sensing mode. Accordingly, the first voltage may be greater than the second voltage. In some examples, during the precharge operation, the memory cell may be coupled with the digit line and the plate line, which may bias the memory cell to a bias voltage 415 (e.g., a positive voltage). Alternatively, the memory cell may remain at an unbiased voltage 410 (e.g., a ground, or approximately 0V) during the precharge operation.

The time t2 may correspond to an access operation (e.g., read operation) in the second sensing mode. A read pulse with a second polarity (e.g., a positive voltage) may be applied to the memory cell, which may bias the memory cell (e.g., a ferroelectric capacitor of the memory cell) to the bias voltage 415. In some examples, the read pulse may be applied as a voltage difference via the digit line and the plate line based on the precharge operation. Based on biasing the memory cell, a voltage corresponding to the logic state stored at the memory cell may be output to the sense component for determining the logic state as part of the access operation. In some examples, the reference component may be configured to provide a second reference voltage (e.g., a positive reference voltage) in the second sensing mode, and the sense component may be configured to compare the output voltage to the second reference voltage.

The time t3 may correspond to a precharge operation for the memory cell or a write-back operation for the memory cell. Reading a memory cell using the voltage 415 may cause the logic stored by the memory cell to be a certain state. As such, the read operation may 'destroy' the value stored by the memory cell. If the memory cell is storing the correct state after the read operation (e.g., applying the voltage 415), the memory cell may remain at an unbiased voltage 410 (e.g., a ground, or approximately 0V) during the precharge operation. If the memory cell is storing the wrong state after the read operation (e.g., applying the voltage 415), the memory cell may be biased to voltage 405 (e.g., a negative voltage) to store the correct state in the memory cell. The voltage 405 may be an opposite polarity as voltage 415. Because the read operation may result in the correct logic state being stored in the memory cell, the quantity of times the voltage 405 may be applied as part of the read operation in the second sensing mode is likely fewer than the quantity times the voltage 415 may be applied as part of the read operation in the second sensing mode (e.g., voltage 405 may be applied around 50% of the times that voltage 415 is applied). If a read operation is performed using voltage 415 every time, this imbalance in applying voltage 415 (having a second polarity) and voltage 405 (having a first polarity) in a given read operation may result in imprinting or other degradations in the memory cell.

Systems, devices, and techniques are described for performing read operations with voltages of different polarities to equalize the types of voltages applied to the memory cell over time. For example, a memory device may read a memory cell using polarities of read voltages (e.g., in different sensing modes). By using read voltages of a first polarity and read voltages of a second polarity, the quantity of voltages of different polarities may be more equal and thereby reduce imprinting or other degradations of performance of the memory device.

The times t3, t5, and t7 may correspond to additional precharge operations at the memory cell. The times t3 and t5 may precede additional access operations at the times t4 and t6, respectively. As illustrated in FIG. 4, the access operation at the time t4 may have the first sensing mode, and the access operation at the time t6 may have the second sensing mode. Based on applying read voltages with different polarities in the different sensing modes, a memory device may mitigate stress at the memory cell and improve operational lifetime for the memory cell.

Figure 5:
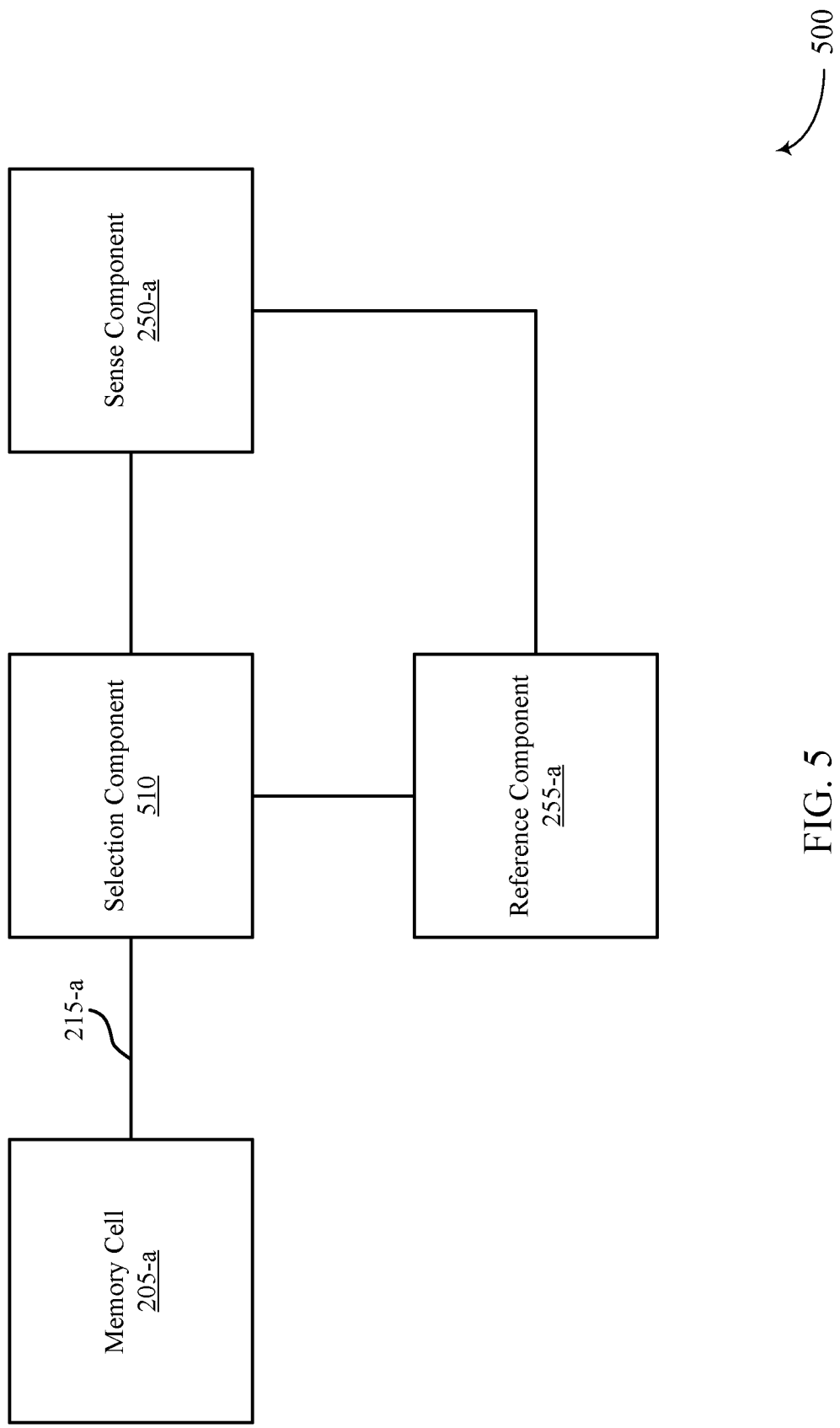
FIG. 5 illustrates an example of a block diagram that supports memory cell sensing stress mitigation in accordance with examples as disclosed herein.

FIG. 5 illustrates an example of a block diagram 500 that supports memory cell sensing stress mitigation in accordance with examples as disclosed herein. The block diagram 500 may illustrate components included in one or more aspects of a memory die or a memory device, or another type of electronic device, as described with reference to FIGS. 1 and 2. For example, the block diagram 500 may include a memory cell 205-*a*, a digit line 215-*a*, a sense component 250-*a*, and a reference component 255-*a*, which may be examples of corresponding components described with reference to FIG. 2. Additionally or alternatively, one or more components illustrated in the block diagram 500 may be included in a device memory controller 155 or a local memory controller 165 or both of a memory device 110 described with reference to FIG. 1, or in a local memory controller 265 of a memory die 200 described with reference to FIG. 2.

According to the techniques described herein, the memory cell 205-a may be biased to a voltage with a first polarity or a second polarity (e.g., a positive voltage or a negative voltage) during an access operation to improve wear of the memory cell 205-a. A selection component 510 may be configured to select a sensing mode for the access operation at the memory cell 205-a. For example, in a first sensing mode, a first pulse with the first polarity (e.g., a negative voltage) may be applied to the memory cell 205-a to read out a first logic state stored at the memory cell 205-a. In a second sensing mode, a second pulse with the second polarity (e.g., a positive voltage) may be applied to the memory cell 205-a to read out a second logic state stored at the memory cell 205-a. In some examples, the voltage may be applied via a digit line 215-a, and the logic state may be read out via the digit line 215-a.

The selection component 510 may be configured to indicate the selected sensing mode to the sense component 250-a and the reference component 255-a. The memory device may use different reference voltages when using different read voltages to read the memory cell to make sure that the read operation identifies the correct state of the memory cell. Based on the selected sensing mode, the reference component 255-a may be configured to provide a corresponding reference voltage, which the sensing component 250-a may compare to a voltage extracted from the memory cell 205-a to determine the logic state stored at the memory cell 205-a. Based on biasing the memory cell 205-a to voltages with different polarities, a memory device may mitigate stress at the memory cell 205-a and improve operational lifetime for the memory cell 205-a.

Figure 6:
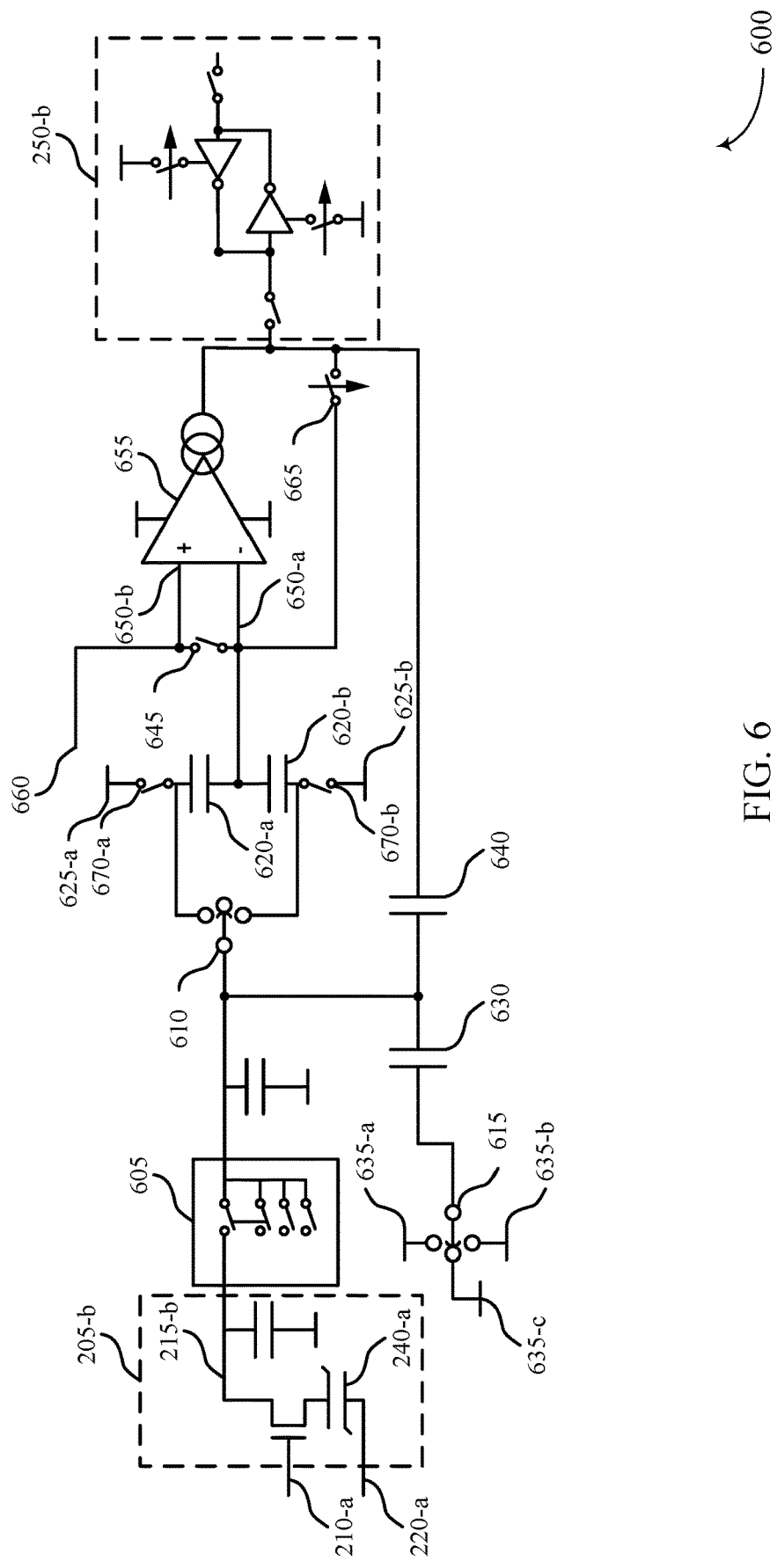
FIG. 6 illustrates an example of a circuit that supports memory cell sensing stress mitigation in accordance with examples as disclosed herein.

FIG. 6 illustrates an example of a circuit 600 that supports memory cell sensing stress mitigation in accordance with examples as disclosed herein. The circuit 600 may illustrate components included in one or more aspects of a memory die or a memory device, or another type of electronic device, as described with reference to FIGS. 1 and 2. For example, the circuit 600 may include a memory cell 205-b, a digit line 215-b, a word line 210-a, a plate line 220-a, a ferroelectric capacitor 240-a, and a sense component 250-b, which may be examples of corresponding components described with reference to FIG. 2. Additionally or alternatively, one or more components illustrated in the circuit 600 may be included in a device memory controller 155 or a local memory controller 165 or both of a memory device 110 described with reference to FIG. 1, or in a local memory controller 265 or a reference component 255 of a memory die 200 described with reference to FIG. 2. The components in the circuit 600 illustrate one possible implementation for biasing the memory cell 205-b to a voltage with a first polarity or a second polarity (e.g., a positive voltage or a negative voltage) during an access operation to improve wear leveling for the memory cell 205-b. In some examples, additional or alternative components or circuits (not shown) may be used to implement the techniques described herein.

The memory cell 205-b may be coupled, via the digit line 215-b, with a selector 605, which may be referred to as a shunt in some cases. The selector 605 may include a set of switches configured to couple the memory cell 205-b to other components of the circuit 600 during an access operation, for example based on a command from a memory controller. During an access operation, the memory cell 205-b may be coupled with an AMPCAP 640, which may be configured to store a charge extracted from the ferroelectric capacitor 240-a, where the extracted charge may correspond to a logic state stored at the memory cell 205-b.

The circuit 600 may include a sensing switch 610 and a reference switch 615. The sensing switch 610 (which may be referred to as a dl_sensing switch) may be operable to couple the digit line 215-b with a voltage source 625-a or 625-b based on a selected sensing mode for an access operation and which polarity of read voltage may be used during a read operation. In some examples, the sensing switch 610 may operate based on an indication or a signal from a selection component, such as a selection component 510 described with reference to FIG. 5. Similarly, the reference switch 615 (which may be referred to as a refApply switch) may be operable to couple a reference capacitor 630 with a reference voltage source 635-a, 635-b, or 635-c based on the selected sensing mode for the access operation and which polarity of read voltage may be used during a read operation. In some examples, each of the sensing switch 610 and the reference switch 615 may include one or more transistors.

The circuit 600 may also include a differential amplifier 655. The differential amplifier 655 may include input nodes 650-a and 650-b. The input node 650-b may be a positive input node (which may be referred to as an inp node) for the differential amplifier 655. The input node 650-b may be maintained at an input voltage 660 (e.g., 0.5 V). The input node 650-a may be a negative input node (which may be referred to as an inn node) and may receive a voltage that is based on the charge extracted from the ferroelectric capacitor 240-a corresponding to the logic state stored at the memory cell 205-b. The differential amplifier 655 may be configured to output an output voltage to the sense component 250-b, where the output voltage may be proportional to the difference between the voltages at the input nodes 650-a and 650-b.

Prior to the access operation, the circuit 600 may be in an idle mode. A short switch 645 between the input nodes 650-a and 650-b may be closed so that the voltages at the input nodes 650-a and 650-b may be equal. The sensing switch 610 may be floating in a central position. The reference switch 615 may couple the reference capacitor 630 with the reference voltage source 635-c, which may provide a negative supply voltage (VS S). A precharge switch 665 may be open, isolating the AMPCAP 640 from the input voltage source 660. A pair of bias switches 670-a and 670-b may be closed, coupling the voltage sources 625-a and 625-b with decoupling capacitors 620-a and 620-b, respectively. The voltage source 625-a may provide a first voltage to the decoupling capacitor 620-a, where the first voltage may be a positive supply voltage (VMSA), and the voltage source 625-b may provide a second voltage to the decoupling capacitor 620-b, where the second voltage may be VSS.

In a first example, the circuit 600 may operate in a first sensing mode for the access operation, which may be referred to as a high sensing mode or a digit line high sensing mode. The sensing switch 610 may couple the digit line 215-b with the voltage source 625-a, which may precharge the digit line 215-b to a first voltage (e.g., VMSA). The plate line 220-a may be precharged to a second voltage (e.g., VSS). Based on precharging the digit line 215-b and the plate line 220-a, the memory cell 205-b may be biased to a first voltage with a first polarity (e.g., a positive voltage).

The reference switch 615 may couple the reference voltage source 635-*a* with the reference capacitor 630, which may provide a first reference voltage (VREF1) to the reference capacitor 630. The short switch 645 may be opened, isolating the input nodes 650-*a* and 650-*b* from one another and enabling the differential amplifier 655. The precharge switch 665 may be closed, and the AMPCAP 640 may be precharged to the input voltage 660. The bias switches 670 may be opened, isolating the voltage sources 625 from the decoupling capacitors 620.

As part of the access operation, the word line 210-*a* may be activated to couple the memory cell 205-*b* with the digit line 215-*b*, the voltage corresponding to the logic state stored at the memory cell 205-*b* may be transferred to the digit line 215-*b*. The reference switch 615 may couple the reference capacitor with a second reference voltage source 635-*c* (e.g., VSS), and a reference charge may be drained from the reference capacitor 630. Based on the transferred voltage, the voltage on the digit line 215-*b* may increase (if the logic state corresponds to a positive voltage) or decrease (if the logic state corresponds to a negative voltage). A feedback mechanism through the AMPCAP 640 may drain the voltage at the digit line 215-*b*, and the voltage transferred from the memory cell 205-*b* may be transferred across the AMPCAP 640. The decoupling capacitor 620-*a* may shift the transferred voltage based on the feedback mechanism, and the shifted voltage across the decoupling capacitor 620-*a* may be input at the input node 650-*a*. The differential amplifier 655 may output an output voltage to the sense component 250-*b* based on the difference between the input voltage 660 at the input node 650-*b* and the shifted voltage at the input node 650-*a*. In some examples, the sense component 250-*b* may be isolated (e.g., using the isolation switch) from the differential amplifier 655 after the output voltage is output to the sense component 250-*b*. In some examples, the sense component may include a latch, which may be fired to determine the logic state stored at the memory cell 205-*b* based on the output voltage.

In a second example, the circuit 600 may operate in a second sensing mode for the access operation, which may be referred to as a low sensing mode or a digit line low sensing mode. The sensing switch 610 may couple the digit line 215-*b* with the voltage source 625-*b*, which may precharge the digit line 215-*b* to the second voltage (e.g., VSS). The plate line 220-*a* may be precharged to the first voltage (e.g., VMSA). Based on precharging the digit line 215-*b* and the plate line 220-*a*, the memory cell 205-*b* may be biased to a second voltage with a second polarity (e.g., a negative voltage).

The reference switch 615 may couple the reference voltage source 635-*b* with the reference capacitor 630, which may provide a second reference voltage (VREF2) to the reference capacitor 630. The short switch 645 may be opened, isolating the input nodes 650-*a* and 650-*b* from one another and enabling the differential amplifier 655. The precharge switch 665 may be closed, and the AMPCAP 640 may be precharged to the input voltage 660. The bias switches 670 may be opened, isolating the voltage sources 625 from the decoupling capacitors 620.

As part of the access operation, the word line 210-*a* may be activated to couple the memory cell 205-*b* with the digit line 215-*b*, the voltage corresponding to the logic state stored at the memory cell 205-*b* may be transferred to the digit line 215-*b*. The reference switch 615 may couple the reference capacitor with a second reference voltage source 635-*c* (e.g., VSS), and the reference charge may be injected to the reference capacitor 630. Based on the transferred voltage, the voltage on the digit line 215-*b* may increase (if the logic state corresponds to a positive voltage) or decrease (if the logic state corresponds to a negative voltage). The feedback mechanism through the AMPCAP 640 may drain the voltage at the digit line 215-*b*, and the voltage transferred from the memory cell 205-*b* may be transferred across the AMPCAP 640. The decoupling capacitor 620-*b* may shift the transferred voltage based on the feedback mechanism, and the shifted voltage across the decoupling capacitor 620-*b* may be input at the input node 650-*a*. The differential amplifier 655 may output an output voltage to the sense component 250-*b* based on the difference between the input voltage 660 at the input node 650-*b* and the shifted voltage at the input node 650-*a*. In some examples, the sense component 250-*b* may be isolated (e.g., using the isolation switch) from the differential amplifier 655 after the output voltage is output to the sense component 250-*b*. In some examples, the latch at the sense component 250-*b* may be fired to determine the logic state stored at the memory cell 205-*b* based on the output voltage.

Based on biasing the memory cell 205-*b* to voltages with different polarities (e.g., the first polarity or the second polarity), the circuit 300 may mitigate stress at the memory cell 205-*a* and improve operational lifetime for the memory cell 205-*b*.

Figure 7:
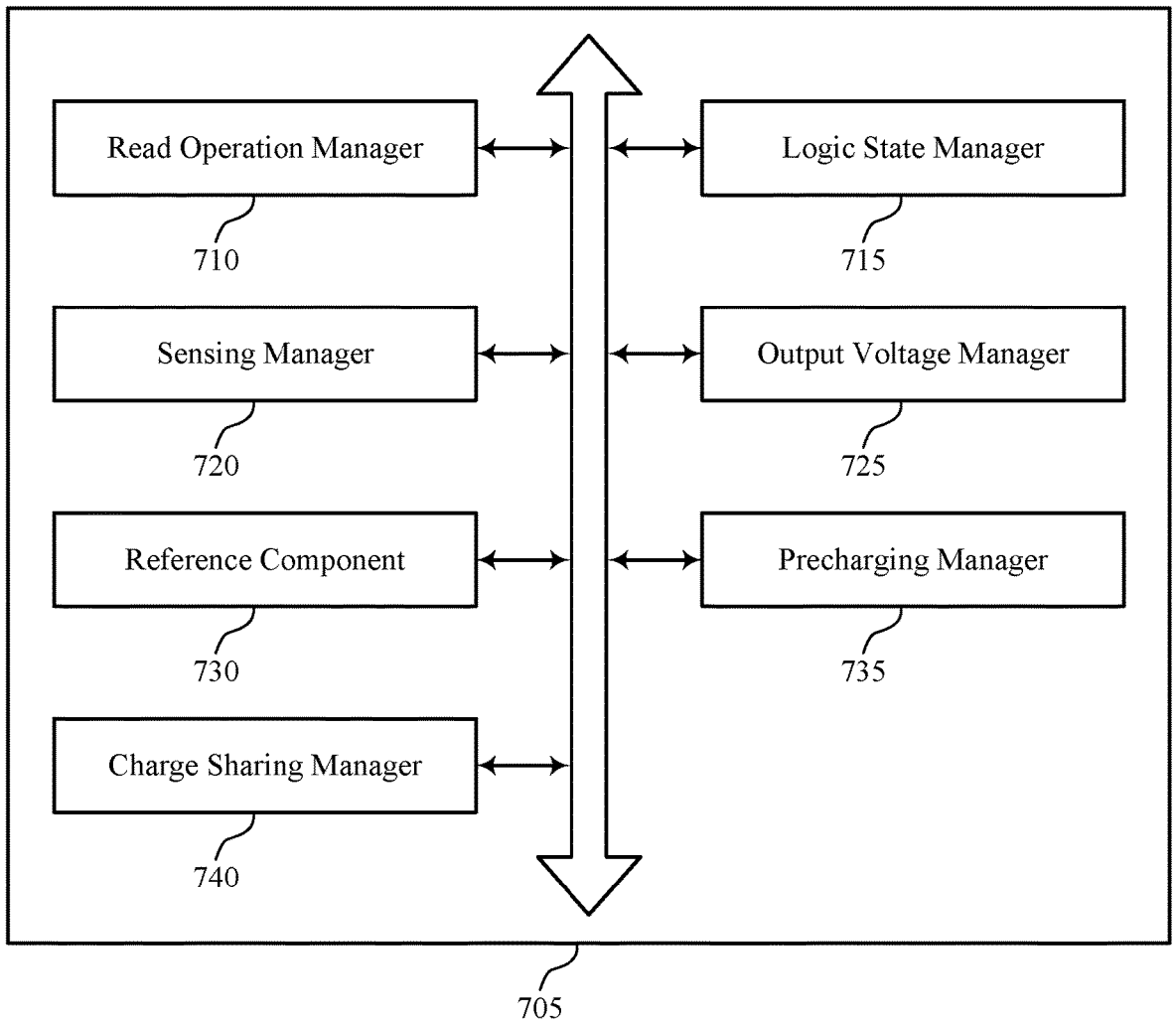
FIG. 7 shows a block diagram of a memory device that supports memory cell sensing stress mitigation in accordance with examples as disclosed herein.

FIG. 7 shows a block diagram 700 of a memory device 705 that supports memory cell sensing stress mitigation in accordance with examples as disclosed herein. The memory device 705 may be an example of aspects of a memory device as described with reference to FIGS. 1 and 2. The memory device 705 may include a read operation manager 710, a logic state manager 715, a sensing manager 720, an output voltage manager 725, a reference component 730, a precharging manager 735, and a charge sharing manager 740. Each of these modules may communicate, directly or indirectly, with one another (e.g., via one or more buses).

The read operation manager 710 may apply, to a ferroelectric memory cell, a first read pulse having a first polarity as part of a first read operation of the ferroelectric memory cell. The logic state manager 715 may output a first logic state stored by the ferroelectric memory cell based on applying the first read pulse as part of the first read operation. In some examples, the read operation manager 710 may apply, to the ferroelectric memory cell, a second read pulse having a second polarity different from the first polarity as part of a second read operation of the ferroelectric memory cell. In some examples, the logic state manager 715 may output a second logic state stored by the ferroelectric memory cell based on applying the second read pulse as part of the second read operation.

In some examples, the logic state manager 715 may determine the first logic state stored by the ferroelectric memory cell based on the indicating, where outputting the first logic state is based on determining the first logic state. In some examples, the logic state manager 715 may determine the second logic state stored by the ferroelectric memory cell based on the indicating, where outputting the second logic state is based on determining the second logic state. In some examples, the logic state manager 715 may determine the first logic state stored by the ferroelectric memory cell based on the third voltage transferred to the capacitor. In some examples, the logic state manager 715 may determine the second logic state stored by the ferroelectric memory cell based on the fourth voltage transferred to the capacitor.

The sensing manager 720 may indicate, to a sense component, that the first read pulse is used to read the ferroelectric memory cell as part of the first read operation based on applying the first read pulse. In some examples, the sensing manager 720 may indicate, to the sense component, that the second read pulse is used to read the ferroelectric memory cell as part of the second read operation based on applying the second read pulse. In some examples, the sensing manager 720 may compare, using a sense component, the third voltage transferred to the capacitor and a reference voltage, where determining the first logic state is based on comparing the third voltage and the reference voltage.

The output voltage manager 725 may output, using a differential amplifier, a first output voltage to the sense component as part of the first read operation, where determining the first logic state stored by the ferroelectric memory cell is based on the first output voltage of the differential amplifier. In some examples, the output voltage manager 725 may output, using the differential amplifier, a second output voltage to the sense component as part of the second read operation, where determining the second logic state stored by the ferroelectric memory cell is based on the second output voltage.

The reference component 730 may couple a reference capacitor with a first reference voltage source as part of the first read operation, where the first read pulse is applied based on coupling the reference capacitor with the first reference voltage source. In some examples, the reference component 730 may couple the reference capacitor with a second reference voltage source as part of the second read operation, where the second read pulse is applied based on coupling the reference capacitor with the second reference voltage source.

The precharging manager 735 may precharge, as part of the first read operation, a digit line to a first voltage. In some examples, the precharging manager 735 may precharge, as part of the first read operation, a plate line to a second voltage different from the first voltage. In some examples, the precharging manager 735 may precharge, as part of the second read operation, the digit line to the second voltage. In some examples, the precharging manager 735 may precharge, as part of the second read operation, the plate line to the first voltage.

The charge sharing manager 740 may transfer, as part of the first read operation, a third voltage associated with the ferroelectric memory cell via the digit line to a capacitor based on precharging the digit line and the plate line. In some examples, the charge sharing manager 740 may bias a word line to couple the ferroelectric memory cell with the digit line. In some examples, the charge sharing manager 740 may initiate, based on biasing the word line, charge sharing between the ferroelectric memory cell and the capacitor, where transferring the third voltage to the capacitor is based on initiating the charge sharing. In some examples, the charge sharing manager 740 may transfer, as part of the second read operation, a fourth voltage associated with the ferroelectric memory cell via the digit line to the capacitor based on precharging the digit line and the plate line.

Figure 8:
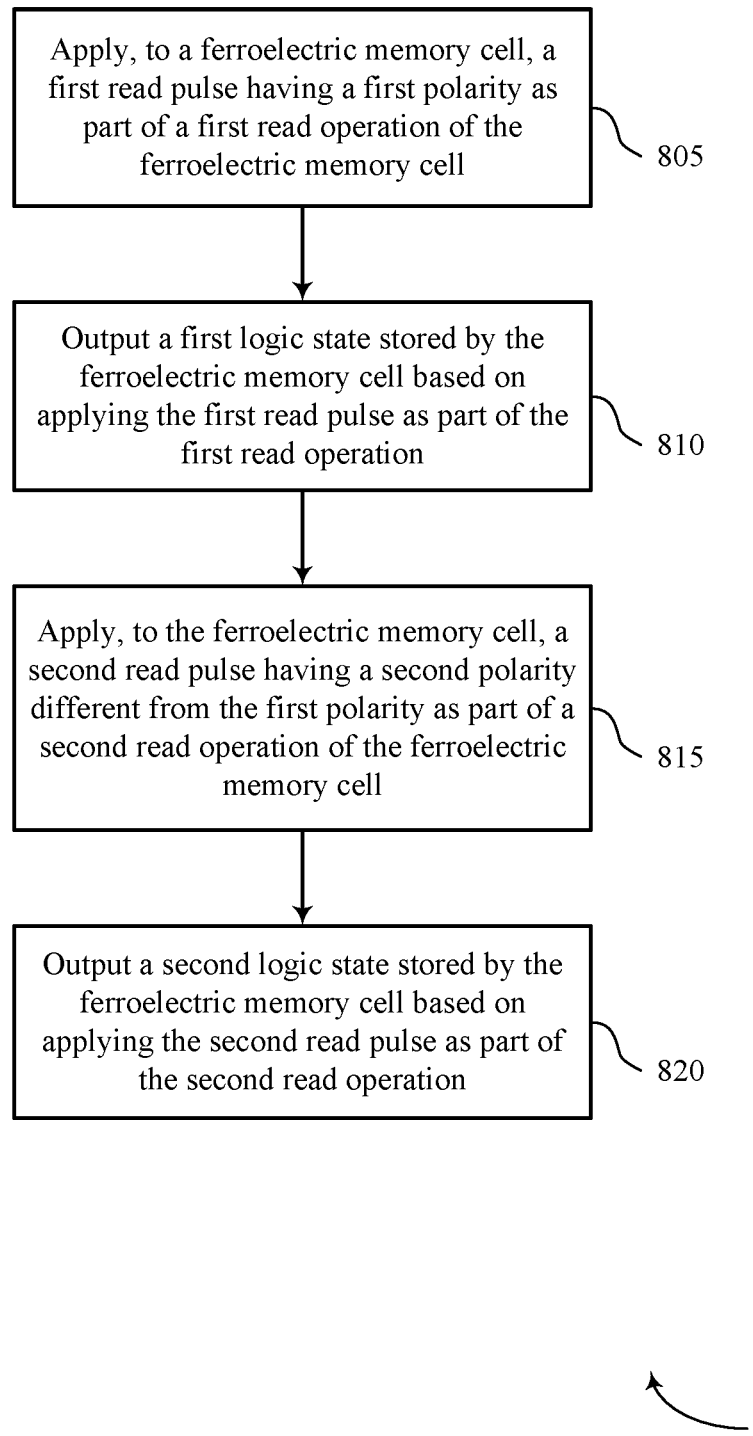
FIG. 8 shows a flowchart illustrating a method or methods that support memory cell sensing stress mitigation in accordance with examples as disclosed herein.

FIG. 8 shows a flowchart illustrating a method or methods 800 that supports memory cell sensing stress mitigation in accordance with examples as disclosed herein. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may apply, to a ferroelectric memory cell, a first read pulse having a first polarity as part of a first read operation of the ferroelectric memory cell. The operations of 805 may be performed according to the methods described herein. In some examples, aspects of the operations of 805 may be performed by a read operation manager as described with reference to FIG. 7.

At 810, the memory device may output a first logic state stored by the ferroelectric memory cell based on applying the first read pulse as part of the first read operation. The operations of 810 may be performed according to the methods described herein. In some examples, aspects of the operations of 810 may be performed by a logic state manager as described with reference to FIG. 7.

At 815, the memory device may apply, to the ferroelectric memory cell, a second read pulse having a second polarity different from the first polarity as part of a second read operation of the ferroelectric memory cell. The operations of 815 may be performed according to the methods described herein. In some examples, aspects of the operations of 815 may be performed by a read operation manager as described with reference to FIG. 7.

At 820, the memory device may output a second logic state stored by the ferroelectric memory cell based on applying the second read pulse as part of the second read operation. The operations of 820 may be performed according to the methods described herein. In some examples, aspects of the operations of 820 may be performed by a logic state manager as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for applying, to a ferroelectric memory cell, a first read pulse having a first polarity as part of a first read operation of the ferroelectric memory cell, outputting a first logic state stored by the ferroelectric memory cell based on applying the first read pulse as part of the first read operation, applying, to the ferroelectric memory cell, a second read pulse having a second polarity different from the first polarity as part of a second read operation of the ferroelectric memory cell, and outputting a second logic state stored by the ferroelectric memory cell based on applying the second read pulse as part of the second read operation.

Some examples of the method 800 and the apparatus described herein may further include operations, features, means, or instructions for indicating, to a sense component, that the first read pulse may be used to read the ferroelectric memory cell as part of the first read operation based on applying the first read pulse, and determining the first logic state stored by the ferroelectric memory cell based on the indicating, where outputting the first logic state may be based on determining the first logic state.

Some examples of the method 800 and the apparatus described herein may further include operations, features, means, or instructions for indicating, to the sense component, that the second read pulse may be used to read the ferroelectric memory cell as part of the second read operation based on applying the second read pulse, and determining the second logic state stored by the ferroelectric memory cell based on the indicating, where outputting the second logic state may be based on determining the second logic state.

Some examples of the method 800 and the apparatus described herein may further include operations, features, means, or instructions for outputting, using a differential amplifier, a first output voltage to the sense component as part of the first read operation, where determining the first logic state stored by the ferroelectric memory cell may be based on the first output voltage of the differential amplifier, and outputting, using the differential amplifier, a second output voltage to the sense component as part of the second read operation, where determining the second logic state stored by the ferroelectric memory cell may be based on the second output voltage.

Some examples of the method 800 and the apparatus described herein may further include operations, features, means, or instructions for coupling a reference capacitor with a first reference voltage source as part of the first read operation, where the first read pulse may be applied based on coupling the reference capacitor with the first reference voltage source, and coupling the reference capacitor with a second reference voltage source as part of the second read operation, where the second read pulse may be applied based on coupling the reference capacitor with the second reference voltage source.

Some examples of the method 800 and the apparatus described herein may further include operations, features, means, or instructions for precharging, as part of the first read operation, a digit line to a first voltage, precharging, as part of the first read operation, a plate line to a second voltage different from the first voltage, transferring, as part of the first read operation, a third voltage associated with the ferroelectric memory cell via the digit line to a capacitor based on precharging the digit line and the plate line, and determining the first logic state stored by the ferroelectric memory cell based on the third voltage transferred to the capacitor.

Some examples of the method 800 and the apparatus described herein may further include operations, features, means, or instructions for biasing a word line to couple the ferroelectric memory cell with the digit line, and initiating, based on biasing the word line, charge sharing between the ferroelectric memory cell and the capacitor, where transferring the third voltage to the capacitor may be based on initiating the charge sharing.

Some examples of the method 800 and the apparatus described herein may further include operations, features, means, or instructions for comparing, using a sense component, the third voltage transferred to the capacitor and a reference voltage, where determining the first logic state may be based on comparing the third voltage and the reference voltage.

Some examples of the method 800 and the apparatus described herein may further include operations, features, means, or instructions for precharging, as part of the second read operation, the digit line to the second voltage, precharging, as part of the second read operation, the plate line to the first voltage, transferring, as part of the second read operation, a fourth voltage associated with the ferroelectric memory cell via the digit line to the capacitor based on precharging the digit line and the plate line, and determining the second logic state stored by the ferroelectric memory cell based on the fourth voltage transferred to the capacitor.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a ferroelectric memory cell, a selection component operable to select a sensing mode for the ferroelectric memory cell selected from a first sensing mode or a second sensing mode, a reference component operable to provide a reference voltage based on the selected sensing mode, and a sense component coupled with the selection component and the reference component and operable to determine a logic state stored by the ferroelectric memory cell based on the selected sensing mode.

Some examples of the apparatus may include a capacitor selectively couplable with the ferroelectric memory cell and operable to receive a voltage from the ferroelectric memory cell based on the selected sensing mode, and a reference capacitor operable to receive the reference voltage from the reference component based on the selected sensing mode, where the sense component may be operable to determine the logic state based on the voltage received by the capacitor and the reference voltage received by the reference capacitor.

Some examples of the apparatus may include a set of capacitors selectively couplable with the capacitor, each capacitor of the set of capacitors operable to shift the voltage received at the capacitor based on the selected sensing mode, and a differential amplifier coupled with the set of capacitors and operable to output an output voltage to the sense component based on the shifted voltage, where the sense component may be operable to determine the logic state stored by the ferroelectric memory cell based on the output voltage.

In some examples, the sense component includes a latch.

In some examples, the selection component may be further operable to indicate the selected sensing mode to the sense component.

In some examples, the reference component may include a first reference voltage source operable to provide a first reference voltage associated with the first sensing mode, a second reference voltage source operable to provide a second reference voltage associated with the second sensing mode, the second reference voltage different from the first reference voltage, and one or more transistors operable to couple the first reference voltage source or the second reference voltage source with a reference capacitor based on the selected sensing mode, where the reference voltage received at the reference capacitor includes the first reference voltage or the second reference voltage.

Some examples of the apparatus may include a digit line selectively couplable with the ferroelectric memory cell and a capacitor operable to receive a voltage from the ferroelectric memory cell based on the selected sensing mode, a first voltage source operable to precharge the digit line to a first voltage associated with the first sensing mode, a second voltage source operable to precharge the digit line to a second voltage associated with the second sensing mode, the second voltage different from the first voltage, and one or more transistors operable to couple the first voltage source or the second voltage source with the digit line based on the selected sensing mode.

Some examples of the apparatus may include a word line operable to couple the ferroelectric memory cell with the digit line, where the capacitor may be further operable to receive the voltage from the ferroelectric memory cell via the digit line based on the word line coupling the ferroelectric memory cell with the digit line.

An apparatus is described. The apparatus may include an array of ferroelectric memory cells and a controller coupled with the array and operable to cause the apparatus to apply, to a ferroelectric memory cell of the array of ferroelectric memory cells, a first read pulse having a first polarity as part of a first read operation of the ferroelectric memory cell, output a first logic state stored by the ferroelectric memory cell based on applying the first read pulse as part of the first read operation, apply, to the ferroelectric memory cell, a second read pulse having a second polarity different from the first polarity as part of a second read operation of the ferroelectric memory cell, and output a second logic state stored by the ferroelectric memory cell based on applying the second read pulse as part of the second read operation.

Some examples of the apparatus may include a sense component, where the controller may be further operable to cause the apparatus to apply, to a ferroelectric memory cell of the array of ferroelectric memory cells, a first read pulse having a first polarity as part of a first read operation of the ferroelectric memory cell, output a first logic state stored by the ferroelectric memory cell based on applying the first read pulse as part of the first read operation, apply, to the ferroelectric memory cell, a second read pulse having a second polarity different from the first polarity as part of a second read operation of the ferroelectric memory cell, and output a second logic state stored by the ferroelectric memory cell based on applying the second read pulse as part of the second read operation.

In some examples of the apparatus, the controller may be further operable to indicate, to the sense component, that the second read pulse may be used to read the ferroelectric memory cell as part of the second read operation based on applying the second read pulse, and determine the second logic state stored by the ferroelectric memory cell based on the indicating, where outputting the second logic state may be based on determining the second logic state.

Some examples of the apparatus may include a differential amplifier, where the controller may be further operable to cause the apparatus to output, using the differential amplifier, a first output voltage to the sense component as part of the first read operation, where determining the first logic state stored by the ferroelectric memory cell is based on the first output voltage of the differential amplifier, and output, using the differential amplifier, a second output voltage to the sense component as part of the second read operation, where determining the second logic state stored by the ferroelectric memory cell is based on the second output voltage.

Some examples of the apparatus may include a reference capacitor, a first reference voltage source, and a second reference voltage source, where the controller may be further operable to cause the apparatus to couple the reference capacitor with the first reference voltage source as part of the first read operation, where the first read pulse is applied based on coupling the reference capacitor with the first reference voltage source, and couple the reference capacitor with the second reference voltage source as part of the second read operation, where the second read pulse is applied based on coupling the reference capacitor with the second reference voltage source.

Some examples of the apparatus may include a digit line, a plate line, and a capacitor selectively couplable with the ferroelectric memory cell, where the controller may be further operable to cause the apparatus to precharge, as part of the first read operation, the digit line to a first voltage, precharge, as part of the first read operation, the plate line to a second voltage different from the first voltage, transfer, as part of the first read operation, a third voltage associated with the ferroelectric memory cell via the digit line to the capacitor based on precharging the digit line and the plate line, and determine the first logic state stored by the ferroelectric memory cell based on the third voltage transferred to the capacitor.

Some examples of the apparatus may include a set of word lines, where the controller may be further operable to cause the apparatus to bias a word line of the set of word lines to couple the ferroelectric memory cell with the digit line, and initiate, based on biasing the word line, charge sharing between the ferroelectric memory cell and the capacitor, where transferring the third voltage to the capacitor is based on initiating the charge sharing.

In some examples of the apparatus, the controller may be further operable to precharge, as part of the second read operation, the digit line to the second voltage, precharge, as part of the second read operation, the plate line to the first voltage, transfer, as part of the second read operation, a fourth voltage associated with the ferroelectric memory cell via the digit line to the capacitor based on precharging the digit line and the plate line, and determine the second logic state stored by the ferroelectric memory cell based on the fourth voltage transferred to the capacitor.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   applying, to a ferroelectric memory cell, a first read pulse having a first polarity as part of a first read operation of the ferroelectric memory cell;
   outputting a first logic state stored by the ferroelectric memory cell based at least in part on applying the first read pulse as part of the first read operation;
   applying, to the ferroelectric memory cell, a second read pulse having a second polarity different from the first polarity as part of a second read operation of the ferroelectric memory cell; and
   outputting a second logic state stored by the ferroelectric memory cell based at least in part on applying the second read pulse as part of the second read operation.

2. The method of claim 1, further comprising:
   indicating, to a sense component, that the first read pulse is used to read the ferroelectric memory cell as part of the first read operation based at least in part on applying the first read pulse; and
   determining the first logic state stored by the ferroelectric memory cell based at least in part on the indicating, wherein outputting the first logic state is based at least in part on determining the first logic state.

3. The method of claim 2, further comprising:
   indicating, to the sense component, that the second read pulse is used to read the ferroelectric memory cell as part of the second read operation based at least in part on applying the second read pulse; and
   determining the second logic state stored by the ferroelectric memory cell based at least in part on the indicating, wherein outputting the second logic state is based at least in part on determining the second logic state.

4. The method of claim 3, further comprising:
   outputting, using a differential amplifier, a first output voltage to the sense component as part of the first read operation, wherein determining the first logic state stored by the ferroelectric memory cell is based at least in part on the first output voltage of the differential amplifier; and
   outputting, using the differential amplifier, a second output voltage to the sense component as part of the second read operation, wherein determining the second logic state stored by the ferroelectric memory cell is based at least in part on the second output voltage.

5. The method of claim 1, further comprising:
   coupling a reference capacitor with a first reference voltage source as part of the first read operation, wherein the first read pulse is applied based at least in part on coupling the reference capacitor with the first reference voltage source; and
   coupling the reference capacitor with a second reference voltage source as part of the second read operation, wherein the second read pulse is applied based at least in part on coupling the reference capacitor with the second reference voltage source.

6. The method of claim 1, further comprising:
   precharging, as part of the first read operation, a digit line to a first voltage;
   precharging, as part of the first read operation, a plate line to a second voltage different from the first voltage;
   transferring, as part of the first read operation, a third voltage associated with the ferroelectric memory cell via the digit line to a capacitor based at least in part on precharging the digit line and the plate line; and
   determining the first logic state stored by the ferroelectric memory cell based at least in part on the third voltage transferred to the capacitor.

7. The method of claim 6, further comprising:
   biasing a word line to couple the ferroelectric memory cell with the digit line; and
   initiating, based at least in part on biasing the word line, charge sharing between the ferroelectric memory cell and the capacitor, wherein transferring the third voltage to the capacitor is based at least in part on initiating the charge sharing.

8. The method of claim 6, further comprising:
   comparing, using a sense component, the third voltage transferred to the capacitor and a reference voltage, wherein determining the first logic state is based at least in part on comparing the third voltage and the reference voltage.

9. The method of claim 6, further comprising:
   precharging, as part of the second read operation, the digit line to the second voltage;
   precharging, as part of the second read operation, the plate line to the first voltage;
   transferring, as part of the second read operation, a fourth voltage associated with the ferroelectric memory cell via the digit line to the capacitor based at least in part on precharging the digit line and the plate line; and
   determining the second logic state stored by the ferroelectric memory cell based at least in part on the fourth voltage transferred to the capacitor.

10. An apparatus, comprising:
    a ferroelectric memory cell;
    a selection component operable to select a sensing mode for the ferroelectric memory cell selected from a first sensing mode or a second sensing mode;
    a reference component operable to provide a reference voltage based at least in part on the selected sensing mode; and
    a sense component coupled with the selection component and the reference component and operable to determine a logic state stored by the ferroelectric memory cell based at least in part on the selected sensing mode, wherein the selection component is further operable to indicate the selected sensing mode to the sense component.

11. The apparatus of claim 10, further comprising:
a capacitor selectively couplable with the ferroelectric memory cell and operable to receive a voltage from the ferroelectric memory cell based at least in part on the selected sensing mode; and
a reference capacitor operable to receive the reference voltage from the reference component based at least in part on the selected sensing mode, wherein the sense component is operable to determine the logic state based at least in part on the voltage received by the capacitor and the reference voltage received by the reference capacitor.

12. The apparatus of claim 11, further comprising:
a set of capacitors selectively couplable with the capacitor, each capacitor of the set of capacitors operable to shift the voltage received at the capacitor based at least in part on the selected sensing mode; and
a differential amplifier coupled with the set of capacitors and operable to output an output voltage to the sense component based at least in part on the shifted voltage, wherein the sense component is operable to determine the logic state stored by the ferroelectric memory cell based at least in part on the output voltage.

13. The apparatus of claim 10, wherein the sense component comprises a latch.

14. The apparatus of claim 10, wherein the reference component comprises:
a first reference voltage source operable to provide a first reference voltage associated with the first sensing mode;
a second reference voltage source operable to provide a second reference voltage associated with the second sensing mode, the second reference voltage different from the first reference voltage; and
one or more transistors operable to couple the first reference voltage source or the second reference voltage source with a reference capacitor based at least in part on the selected sensing mode, wherein the reference voltage received at the reference capacitor comprises the first reference voltage or the second reference voltage.

15. The apparatus of claim 10, further comprising:
a digit line selectively couplable with the ferroelectric memory cell and a capacitor operable to receive a voltage from the ferroelectric memory cell based at least in part on the selected sensing mode;
a first voltage source operable to precharge the digit line to a first voltage associated with the first sensing mode;
a second voltage source operable to precharge the digit line to a second voltage associated with the second sensing mode, the second voltage different from the first voltage; and
one or more transistors operable to couple the first voltage source or the second voltage source with the digit line based at least in part on the selected sensing mode.

16. The apparatus of claim 15, further comprising:
a word line operable to couple the ferroelectric memory cell with the digit line, wherein the capacitor is further operable to receive the voltage from the ferroelectric memory cell via the digit line based at least in part on the word line coupling the ferroelectric memory cell with the digit line.

17. An apparatus, comprising:
an array of ferroelectric memory cells; and
a controller coupled with the array and operable to cause the apparatus to:
apply, to a ferroelectric memory cell of the array of ferroelectric memory cells, a first read pulse having a first polarity as part of a first read operation of the ferroelectric memory cell;
output a first logic state stored by the ferroelectric memory cell based at least in part on applying the first read pulse as part of the first read operation;
apply, to the ferroelectric memory cell, a second read pulse having a second polarity different from the first polarity as part of a second read operation of the ferroelectric memory cell; and
output a second logic state stored by the ferroelectric memory cell based at least in part on applying the second read pulse as part of the second read operation.

18. The apparatus of claim 17, further comprising:
a sense component,
wherein the controller is further operable to cause the apparatus to:
indicate, to the sense component, that the first read pulse is used to read the ferroelectric memory cell as part of the first read operation based at least in part on applying the first read pulse; and
determine the first logic state stored by the ferroelectric memory cell based at least in part on the indicating, wherein outputting the first logic state is based at least in part on determining the first logic state.

19. The apparatus of claim 18, wherein the controller is further operable to cause the apparatus to:
indicate, to the sense component, that the second read pulse is used to read the ferroelectric memory cell as part of the second read operation based at least in part on applying the second read pulse; and
determine the second logic state stored by the ferroelectric memory cell based at least in part on the indicating, wherein outputting the second logic state is based at least in part on determining the second logic state.

20. The apparatus of claim 19, further comprising:
a differential amplifier,
wherein the controller is further operable to cause the apparatus to:
output, using the differential amplifier, a first output voltage to the sense component as part of the first read operation, wherein determining the first logic state stored by the ferroelectric memory cell is based at least in part on the first output voltage of the differential amplifier; and
output, using the differential amplifier, a second output voltage to the sense component as part of the second read operation, wherein determining the second logic state stored by the ferroelectric memory cell is based at least in part on the second output voltage.

21. The apparatus of claim 17, further comprising:
a reference capacitor;
a first reference voltage source; and
a second reference voltage source,
wherein the controller is further operable to cause the apparatus to:
couple the reference capacitor with the first reference voltage source as part of the first read operation, wherein the first read pulse is applied based at least in part on coupling the reference capacitor with the first reference voltage source; and
couple the reference capacitor with the second reference voltage source as part of the second read operation, wherein the second read pulse is applied based at least in part on coupling the reference capacitor with the second reference voltage source.

22. The apparatus of claim 17, further comprising:
a digit line;
a plate line; and
a capacitor selectively couplable with the ferroelectric memory cell,
wherein the controller is further operable to cause the apparatus to:
precharge, as part of the first read operation, the digit line to a first voltage;
precharge, as part of the first read operation, the plate line to a second voltage different from the first voltage;
transfer, as part of the first read operation, a third voltage associated with the ferroelectric memory cell via the digit line to the capacitor based at least in part on precharging the digit line and the plate line; and
determine the first logic state stored by the ferroelectric memory cell based at least in part on the third voltage transferred to the capacitor.

23. The apparatus of claim 22, further comprising:
a set of word lines,
wherein the controller is further operable to cause the apparatus to:
bias a word line of the set of word lines to couple the ferroelectric memory cell with the digit line; and
initiate, based at least in part on biasing the word line, charge sharing between the ferroelectric memory cell and the capacitor, wherein transferring the third voltage to the capacitor is based at least in part on initiating the charge sharing.

24. The apparatus of claim 22, wherein the controller is further operable to cause the apparatus to:
precharge, as part of the second read operation, the digit line to the second voltage;
precharge, as part of the second read operation, the plate line to the first voltage;
transfer, as part of the second read operation, a fourth voltage associated with the ferroelectric memory cell via the digit line to the capacitor based at least in part on precharging the digit line and the plate line; and
determine the second logic state stored by the ferroelectric memory cell based at least in part on the fourth voltage transferred to the capacitor.

* * * * *